United States Patent
Kobayashi

(10) Patent No.: US 8,823,455 B2
(45) Date of Patent: Sep. 2, 2014

(54) MATRIX DISTRIBUTED POWER AMPLIFIER

(75) Inventor: Kevin W. Kobayashi, Torrance, CA (US)

(73) Assignee: RF Micro Devices, Inc., Greensboro, NC (US)

(*) Notice: Subject to any disclaimer, the term of this patent is extended or adjusted under 35 U.S.C. 154(b) by 55 days.

(21) Appl. No.: 13/605,134

(22) Filed: Sep. 6, 2012

(65) Prior Publication Data
US 2013/0063213 A1  Mar. 14, 2013

Related U.S. Application Data

(60) Provisional application No. 61/534,095, filed on Sep. 13, 2011.

(51) Int. Cl.
*H03F 3/60* (2006.01)

(52) U.S. Cl.
USPC .................................... 330/286; 330/53

(58) Field of Classification Search
CPC ........................................... H03F 3/60
USPC ................. 330/286, 53, 124 R, 295
See application file for complete search history.

(56) References Cited

U.S. PATENT DOCUMENTS

| | | | |
|---|---|---|---|
| 4,540,954 A | 9/1985 | Apel | |
| 4,543,535 A | 9/1985 | Ayasli | |
| 4,752,746 A * | 6/1988 | Niclas | ............................ 330/277 |
| 4,788,511 A | 11/1988 | Schindler | |
| 5,021,743 A * | 6/1991 | Chu et al. | .......................... 330/54 |
| 5,028,879 A | 7/1991 | Kim | |
| 5,046,155 A | 9/1991 | Beyer et al. | |
| 5,208,547 A | 5/1993 | Schindler | |
| 5,227,734 A | 7/1993 | Schindler et al. | |
| 5,361,038 A | 11/1994 | Allen et al. | |
| 5,365,197 A | 11/1994 | Ikalainen | |
| 5,378,999 A | 1/1995 | Martens et al. | |
| 5,414,387 A | 5/1995 | Nakahara et al. | |
| 5,485,118 A | 1/1996 | Chick | |
| 5,880,640 A | 3/1999 | Dueme | |
| 6,049,250 A | 4/2000 | Kintis et al. | |
| 6,342,815 B1 | 1/2002 | Kobayashi | |
| 6,377,125 B1 | 4/2002 | Pavio et al. | |
| 6,400,226 B2 | 6/2002 | Sato | |

(Continued)

OTHER PUBLICATIONS

Kobayashi, K.W. et al., "Extending the Bandwidth Performance of Heterojunction Bipolar Transistor-based Distributed Amplifiers," IEEE Transactions on Microwave Theory and Techniques, vol. 44, No. 5, May 1996, pp. 739-748.

(Continued)

*Primary Examiner* — Henry Choe
(74) *Attorney, Agent, or Firm* — Withrow & Terranova, P.L.L.C.

(57) ABSTRACT

Disclosed is a matrix distributed amplifier (DA) having an input transmission line, an intermediate transmission line, and an output transmission line. A first plurality of amplifiers has inputs coupled to and spaced along the input transmission line and has outputs coupled to and spaced along the intermediate transmission line. A second plurality of amplifiers has inputs coupled to and spaced along the intermediate transmission line and has outputs coupled to and spaced along the output transmission line. A termination amplifier has an input coupled to the input transmission line and an output coupled to the intermediate transmission line. In at least one embodiment, a second termination amplifier has an input coupled to the intermediate transmission line and an output coupled to the output transmission line.

26 Claims, 9 Drawing Sheets

(56) References Cited

U.S. PATENT DOCUMENTS

| | | | |
|---|---|---|---|
| 6,727,762 | B1 | 4/2004 | Kobayashi |
| 6,759,907 | B2 | 7/2004 | Orr et al. |
| 6,943,631 | B2 | 9/2005 | Scherrer et al. |
| 7,482,868 | B2* | 1/2009 | Hageman et al. ............ 330/133 |
| 7,482,874 | B2 | 1/2009 | Heydari et al. |
| 7,724,091 | B2* | 5/2010 | Vickes et al. ................ 330/286 |
| 7,804,262 | B2 | 9/2010 | Schuster et al. |
| 7,804,362 | B2 | 9/2010 | Nguyen |
| 7,924,097 | B2 | 4/2011 | Lender, Jr. et al. |
| 2003/1843831 | | 10/2003 | Ogawa |
| 2010/0052814 | A1* | 3/2010 | Plaze et al. ................... 333/132 |

OTHER PUBLICATIONS

Robertson, I.D. et al., "Ultrawideband biasing of MMIC distributed amplifiers using improved active load," Electronics Letters, vol. 27, Oct. 10, 1991, pp. 1907-1909.

Ayasli, Yalcin et al., "Capacitively Coupled Traveling-Wave Power Amplifier," IEEE Transactions on Electron Devices, Dec. 1984, pp. 1937-1942, vol. ED-31, No. 12, IEEE.

Ayasli, Yalcin et al., "Monolithic 2-20 GHz GaAs Travelling-Wave Amplifier," Electronic Letters, Jul. 8, 1982, pp. 596-598, vol. 18, IEEE.

Ayasli, Yalcin et al., "Monolithic GaAs Travelling-Wave Amplifier," Electronic Letters, Jun. 11, 1981, pp. 413-414, vol. 17, No. 12, IEEE.

Ayasli, Yalcin et al., "A Monolithic GaAs 1-13-GHz Traveling-Wave Amplifier," IEEE Transactions on Electron Devices, Jul. 1982, pp. 1072-177, vol. 29, No. 7, IEEE.

Ayasli, Yalcin et al., "2-20-GHz GaAs Traveling-Wave Power Amplifier," IEEE Transactions on Microwave Theory and Techniques, Mar. 1984, pp. 290-295, IEEE.

Ayasli, Yalcin et al., "2-20-GHz GaAs Traveling-Wave Amplifier," IEEE Transactions on Microwave Theory and Techniques, Jan. 1984, pp. 71-77, vol. 32, No. 1, IEEE.

Campbell, Charles et al., "A Wideband Power Amplifier MMIC Utilizing GaN on SiC HEMT Technology," IEEE Journal of Solid-State Circuits, Oct. 2009, pp. 2640-2647, vol. 44, No. 10, IEEE.

Duperrier, Cedric et al., "New Design Method of Non-Uniform Distributed Power Amplifiers. Application to a single stage 1 W PHEMT MMIC," 2001 IEEE MTT-S International Microwave Symposium Digest, 2001, pp. 1063-1066, vol. 12, IEEE.

Duperrier, Cedric et al., "New Design Method of Uniform and Non-uniform Distributed Power Amplifiers," IEEE Transactions on Microwave Theory and Techniques, Dec. 2001, pp. 2494-2500, vol. 29, No. 12, IEEE.

Fraysse, J.P. et al., "A 2W high efficiency 2-8GHz cascode HBT MMIC power distributed amplifier," IEEE MTTS Digest, Jun. 2000, pp. 529-532, vol. 1, IEEE.

Gassmann, J. et al., "Wideband, High-Efficiency GaN Power Amplifiers Utilizing a Non-Uniform Distributed Topology," IEEE/MTT-S International Microwave Symposium, Jun. 2007, pp. 615-618, IEEE.

Green, Bruce et al., "Cascode Connected AlGaN/GaN HEMT's on SiC Substrates," IEEE Microwave and Guided Wave Letters, Aug. 2000, pp. 316-318, vol. 10, No. 8, IEEE.

Green, Bruce M. et al., "High-Power Broad-Band AlGaN/GaN HEMT MMICs on SiC Substrates," IEEE Transactions on Microwave Theory and Techniques, Dec. 2001, pp. 2486-2493, vol. 49, No. 12, IEEE.

Martin, A. et al., "Design of GaN-based Balanced Cascode Cells for Wide-band Distributed Power Amplifier," 2007 EuMIC Microwave Integrated Circuit Conference, Oct. 8-10, 2007, pp. 154-157, IEEE.

Meharry, David E. et al., "Multi-Watt Wideband MMICs in GaN and GaAs," IEEE/MTT-S International Microwave Symposium, Jun. 2007, pp. 631-634, IEEE.

Shifrin, M. et al., "A New Power Amplifier Topology With Series Biasing and Power Combining of Transistors," Microwave and Millimeter-Wave Monolithic Circuits Symposium, Jun. 1-3, 1992, pp. 39-41, IEEE.

Van Raay, F. et al., "A Coplanar X-Band AlGaN/GaN Power Amplifier MMIC on s.i. SiC Substrate," IEEE Microwave and Wireless Components Letters, Jul. 2005, pp. 460-462, vol. 15, No. 7, IEEE.

Van Raay, F. et al., "A Microstrip X-Band AlGaN/GaN Power Amplifier MMIC on s.i. SiC Substrate," EGAAS 2005 Gallium Arsenide and Other Semiconductor Application Symposium, Oct. 3-4, 2005, pp. 233-236, IEEE.

Zhao, Lei et al., "A 6 Watt LDMOS Broadband High Efficiency Distributed Power Amplifier Fabricated Using LTCC Technology," 2002 IEEE MTT-S International Microwave Symposium Digest, 2002, pp. 897-900, IEEE.

Non-final Office Action mailed Feb. 24, 2011, regarding U.S. Appl. No. 12/651,717, 11 pages.

Non-final Office Action mailed Feb. 25, 2011 regarding U.S. Appl. No. 12/651,726, 8 pages.

Notice of Allowance mailed Jun. 24, 2011 regarding U.S. Appl. No. 12/651,726, 7 pages.

Non-final Office Action for U.S. Appl. No. 13/154,910 Jan. 4, 2012, 17 pages.

Notice of Allowance for U.S. Appl. No. 13/154,910 mailed Apr. 16, 2012, 5 pages.

Notice of Allowance for U.S. Appl. No. 10/304,593 mailed Dec. 8, 2003, 6 pages.

Non-final Office Action for U.S. Appl. No. 13/154,910 mailed Oct. 1, 2012, 7 pages.

Notice of Allowance for U.S. Appl. No. 13/457,536, mailed Oct. 10, 2013, 10 pages.

* cited by examiner

MATRIX DISTRIBUTED POWER AMPLIFIER

RELATED APPLICATIONS

The present application claims priority to U.S. Provisional Patent Application No. 61/534,095, filed Sep. 13, 2011.

The present application is related to U.S. Pat. No. 6,727,762, entitled DIRECT COUPLED DISTRIBUTED AMPLIFIER, filed Nov. 26, 2002. The present application is related to U.S. Pat. No. 8,035,449, entitled CAPACITIVELY-COUPLED DISTRIBUTED AMPLIFIER WITH BASE-BAND PERFORMANCE, filed Jan. 4, 2010; U.S. patent application Ser. No. 13/154,910, entitled CAPACITIVELY-COUPLED DISTRIBUTED AMPLIFIER WITH BASE-BAND PERFORMANCE, filed Jun. 7, 2011, now U.S. Pat. No. 8,451,059; and U.S. Pat. No. 8,058,930, entitled CAPACITIVELY-COUPLED NON-UNIFORMLY DISTRIBUTED AMPLIFIER, filed Jan. 4, 2010; each of which claims priority to U.S. Provisional Patent Application No. 61/142,283, filed Jan. 2, 2009. U.S. patent application Ser. No. 13/154,910 is a continuation of U.S. Pat. No. 8,035,449, which claims priority to U.S. Provisional Patent Application No. 61/142,283, filed Jan. 2, 2009. The present application is related to U.S. patent application Ser. No. 13/457,536, entitled LOW NOISE-LINEAR POWER DISTRIBUTED AMPLIFIER, filed Apr. 27, 2012, now U.S. Pat. No. 8,665,022, which claims priority to U.S. Provisional Patent Application No. 61/480,106, filed Apr. 28, 2011.

All of the applications listed above are hereby incorporated herein by reference in their entireties.

FIELD OF THE DISCLOSURE

Embodiments of the present disclosure relate to matrix distributed amplifiers, which may be used in radio frequency (RF) communications systems, optical fiber based communications systems, baseband frequency communication systems, or any combinations thereof.

BACKGROUND

Several different amplifier applications require an amplifier having a large gain-bandwidth product. For example, RF signals on optical fibers may require large gain-bandwidth product amplifiers that are highly linear. Some broadband fiber and RF communications applications may require large gain-bandwidth product amplifiers to provide high spectral efficiency. Software configurable communications systems may require an amplifier having a large gain-bandwidth product and a very wide operating bandwidth, which may span baseband frequencies to microwave frequencies. Baseband to microwave instrumentation may require an amplifier having a large gain-bandwidth product and a very wide operating bandwidth.

Distributed amplifiers (DAs) typically use multiple transconductance elements coupled together to provide an amplifier having a larger gain-bandwidth product than is possible with an amplifier using a single comparable transconductance element. A DA may have an input line of inductive elements or transmission line sections coupled in series along with a parallel output line of inductive elements or transmission line sections coupled in series. The input and the output lines have corresponding taps that are coupled to the multiple transconductance elements, such that an input signal, which is applied to one end of the input line, propagates down the input line. As the input signal propagates down the input line, each successive transconductance element receives and amplifies the input signal to feed a corresponding tap into the output line.

Each successive transconductance element adds to the amplified input signal. As such, the amplified input signal propagates down the output line to provide an output signal at the end of the output line. Ideally, the input line and the output line have identical delays, such that the input signal and the amplified input signal stay in phase with one another so that each transconductance element adds to the amplified input signal in phase. However, practical DAs may have phase velocity variations, distortions, or both along the output line that may degrade the linearity of the DA, the efficiency of the DA, or both.

As a result, the gain of a single stage DA even when made from gallium nitride (GaN) or high electron mobility transistor (HEMT) technology may not be sufficient by itself, and an additional DA stage may need to be cascaded with the low noise stage to obtain the desired gain. However, cascading a first stage with a second stage to realize a cascaded two stage amplifier typically compromises noise and linearity in a cascaded RF analysis. Adverse coupling interaction between the first stage and the second stage along with noise contribution of the second stage may result in significant degradation of overall noise figure in comparison with the first stage only. Also the higher gain and signal through the combined first stage and second stage requires an output stage to have better linearity performance than the overall desired cascaded linearity in order to preserve the dynamic range through the cascaded two stage amplifier.

A matrix distributed amplifier is a compact solution which can provide the gain of multiple stages through multiplicative in addition to additive distributed amplification and may alleviate the adverse inter-stage interaction between the first stage and the second stage of a cascaded DA approach by absorbing or incorporating the parasitic effects in a two dimensional distributed fashion. However, the noise performance is limited by the use of traditional resistive terminations of the multiple transmission lines. Thus, it is desirable to have a low noise matrix distributed power amplifier that achieves higher gain and reduced noise figure without significantly compromising other critical performances such as linearity.

SUMMARY

Disclosed is a matrix distributed amplifier (DA) having an input transmission line, an intermediate transmission line, and an output transmission line. A first plurality of amplifiers has inputs coupled to and spaced along the input transmission line and has outputs coupled to and spaced along the intermediate transmission line. A second plurality of amplifiers has inputs coupled to and spaced along the intermediate transmission line and has outputs coupled to and spaced along the output transmission line. A termination amplifier has an input coupled to the input transmission line and an output coupled to the intermediate transmission line. In at least one embodiment, a second termination amplifier has an input coupled to the intermediate transmission line and an output coupled to the output transmission line.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure provides a matrix distributed power amplifier with improved broadband noise performance. In particular, the matrix distributed power amplifier of the present disclosure replaces noisy drain terminations with an amplifier termination stage that results in relatively better broadband noise performance in comparison with a traditional cascaded DA without significantly compromising linearity.

Figure 1:
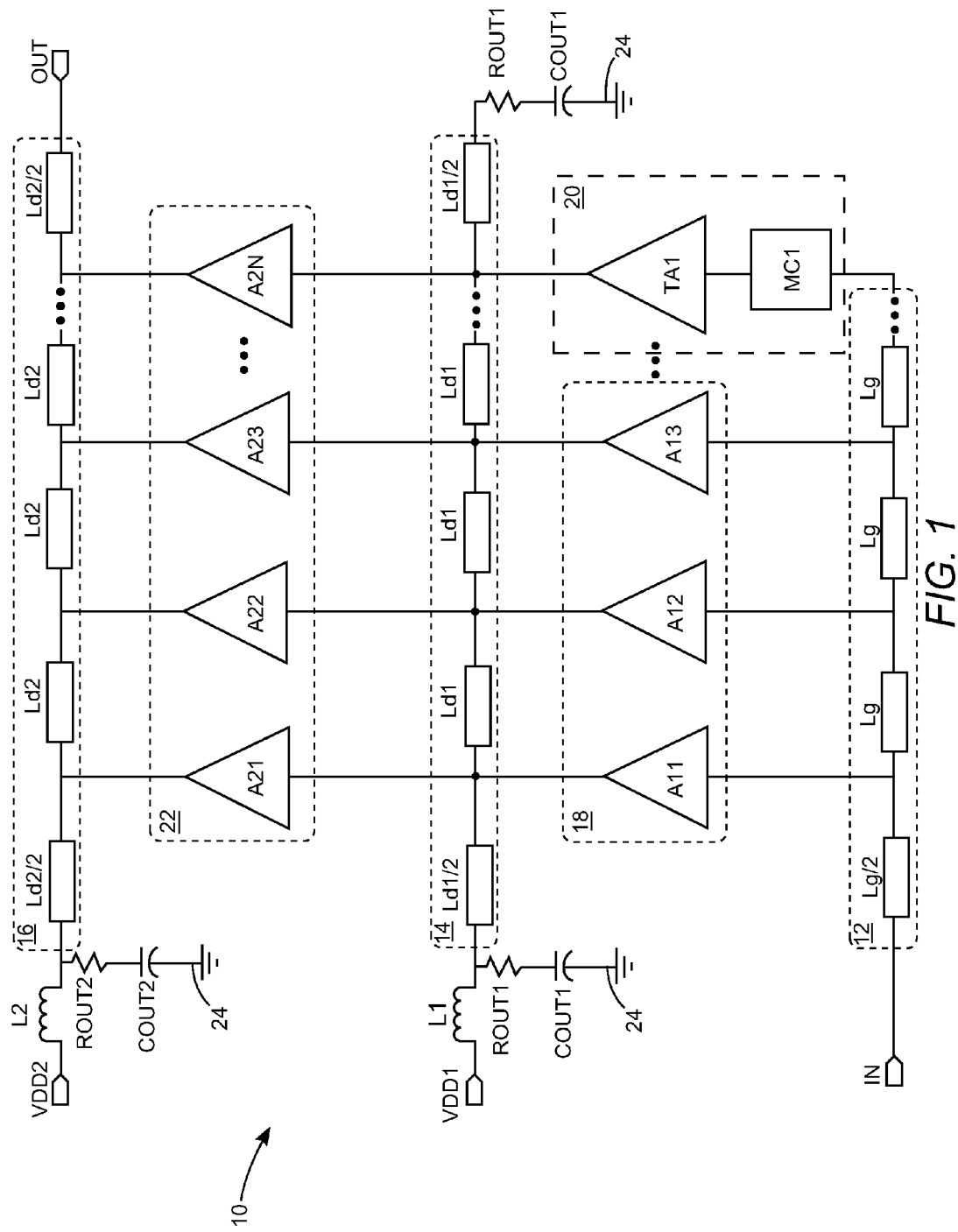
FIG. 1 is a schematic diagram of a basic embodiment of a matrix distributed amplifier having a termination amplifier according to the present disclosure.

FIG. 1 is a schematic diagram that shows the basic topology of a matrix distributed amplifier 10 comprised of an input transmission line 12 made up of inductive elements Lg/2 and Lg, and an intermediate transmission line 14 made up of inductive elements Ld1/2 and Ld1, and an output transmission line 16 made up of inductive elements Ld2/2 and Ld2. A first plurality of amplifiers 18 made up of amplifiers A11, A12, and A13 and an input termination network 20 made up of an amplifier TA1 and an impedance matching circuit MC1 couple the input transmission line 12 to the intermediate transmission line 14. The first plurality of amplifiers 18 provides a first gain. A second plurality of amplifiers 22 made up of amplifiers A21, A22, and A23 through A2N couple the intermediate transmission line 14 to the output transmission line 16. The second plurality of amplifiers 22 provides a second gain. Overall, the matrix distributed amplifier 10 performs as a 2×N matrix amplifier with an effective gain of a cascaded two stage distributed amplifier. As with common distributed amplifier topology practices, the intermediate transmission line may possess termination impedances made up of a series resistor ROUT1 and capacitor COUT1 impedance termination. An additional choke L1 and a first supply voltage VDD1 may be used on either side of the intermediate transmission line 14 to bias the drains of the first plurality of amplifiers of the 2×N matrix DA. The output transmission line 16 may include an output transmission line back terminating impedance comprised of a series combination of an output resistor ROUT2 and a series capacitor COUT2 coupled in series to a common node 24, which is typically ground. Choke L2 and a second supply voltage VDD2 may provide the bias to the second plurality of amplifiers of the 2×N matrix DA.

The embodiment of FIG. 1 improves the broadband noise performance of a traditional matrix distributed amplifier by eliminating the noisy input line terminating resistor that typically terminates the input transmission line, and replacing it with an input terminating amplifier stage whose input impedance may be matched to optimize for broadband low noise and input return-loss match. This is depicted by a terminating amplifier that has an input impedance matching circuit MC1. Various aspects of this terminating amplifier concept may be practiced in order to achieve desired broadband gain, noise, and linearity.

The input terminating amplifier illustrated for the last section of the first plurality of amplifier sections, may be configured in a plurality of sections of the bottom row of amplifiers or even all of the sections. The input terminating amplifier may be configured as a broadband feedback amplifier. The input terminating amplifier may be configured with a large or small device in order to improve the effective broadband terminating impedance of the input transmission line. A plurality of input terminating amplifiers may be configured with tapered device peripheries for successive sections for providing optimum broadband gain, noise and linearity performance. A plurality of input terminating feedback amplifiers may be configured with varying feedback for providing optimum broadband gain, noise and linearity performance.

Figure 2:
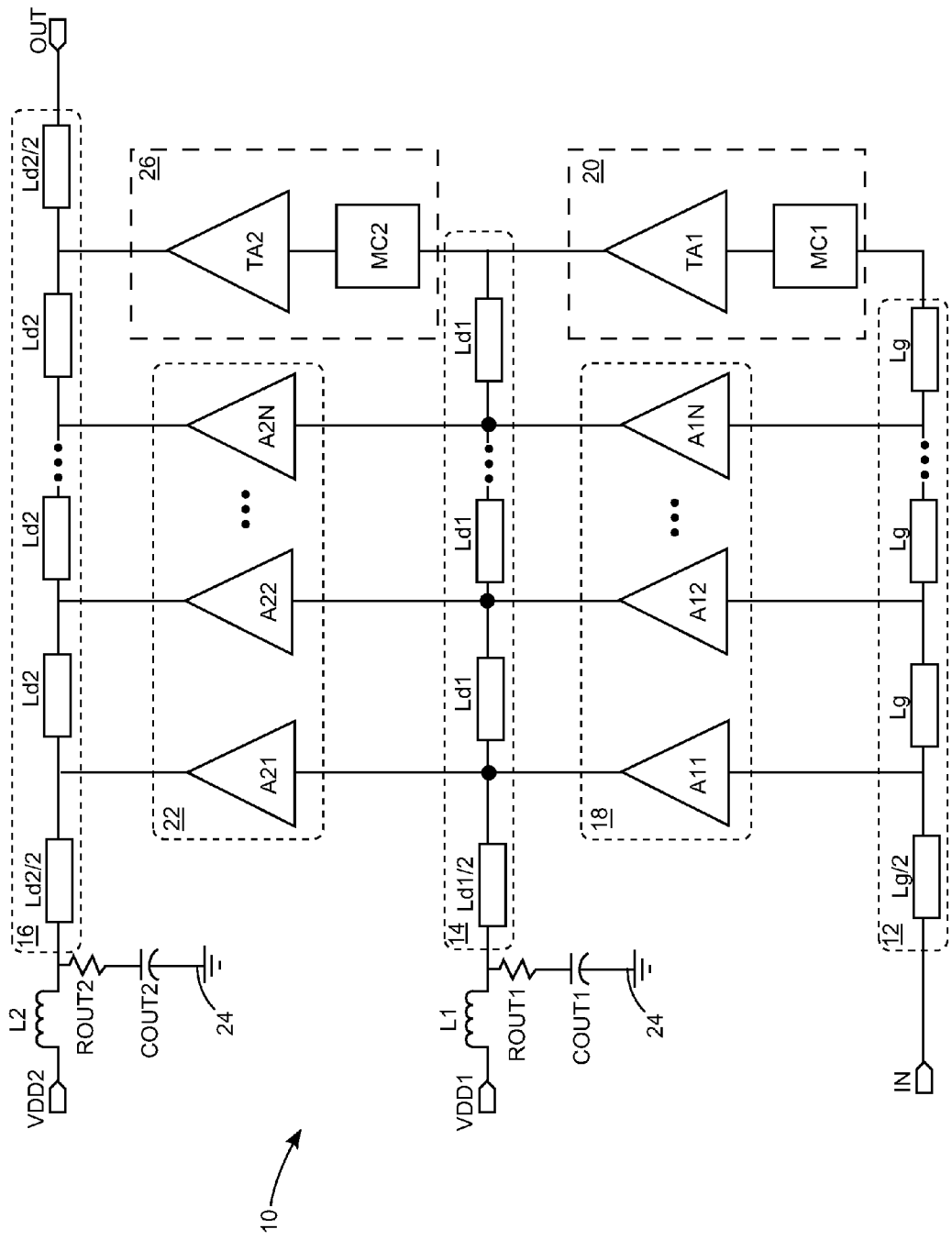
FIG. 2 is a schematic diagram of a modified version of the basic embodiment of the matrix distributed amplifier that further includes a second termination amplifier.

FIG. 2 represents the combined main aspects of the basic embodiment of the present disclosure. In addition to the use of an input transmission line termination amplifier, a second termination amplifier is employed for terminating the intermediate transmission line 14. TA2 represents a terminating amplifier and MC2 represents an input impedance matching circuit. This is a basic representation and may be extended to multiple intermediate transmission lines, which are coupled by a plurality of amplifiers where at least one of the amplifiers is a termination amplifier. The input amplifier and the termination amplifier are depicted as the last or Nth amplifier in a row closest to the output side of the amplifier. Multiple termination amplifiers may be used in a given row, with varying transistor sizes, feedback, for optimizing the overall performance. Note, an intermediate transmission line conventionally requires two terminations, one on the input side of the intermediate transmission line and one on the output side of the intermediate transmission line. Therefore, the addition of a terminating amplifier on the left side of the intermediate transmission line 14 may be used to replace the left side intermediate of the output termination impedance made up by the series combination of the output resistor ROUT1 and the output capacitor COUT1. Additionally, the intermediate terminating impedance comprised of ROUT1/COUT1 may altogether be eliminated so long as at least one section of the amplifier array A21, and A22 through A2N includes the termination amplifier TA2.

Figure 3:
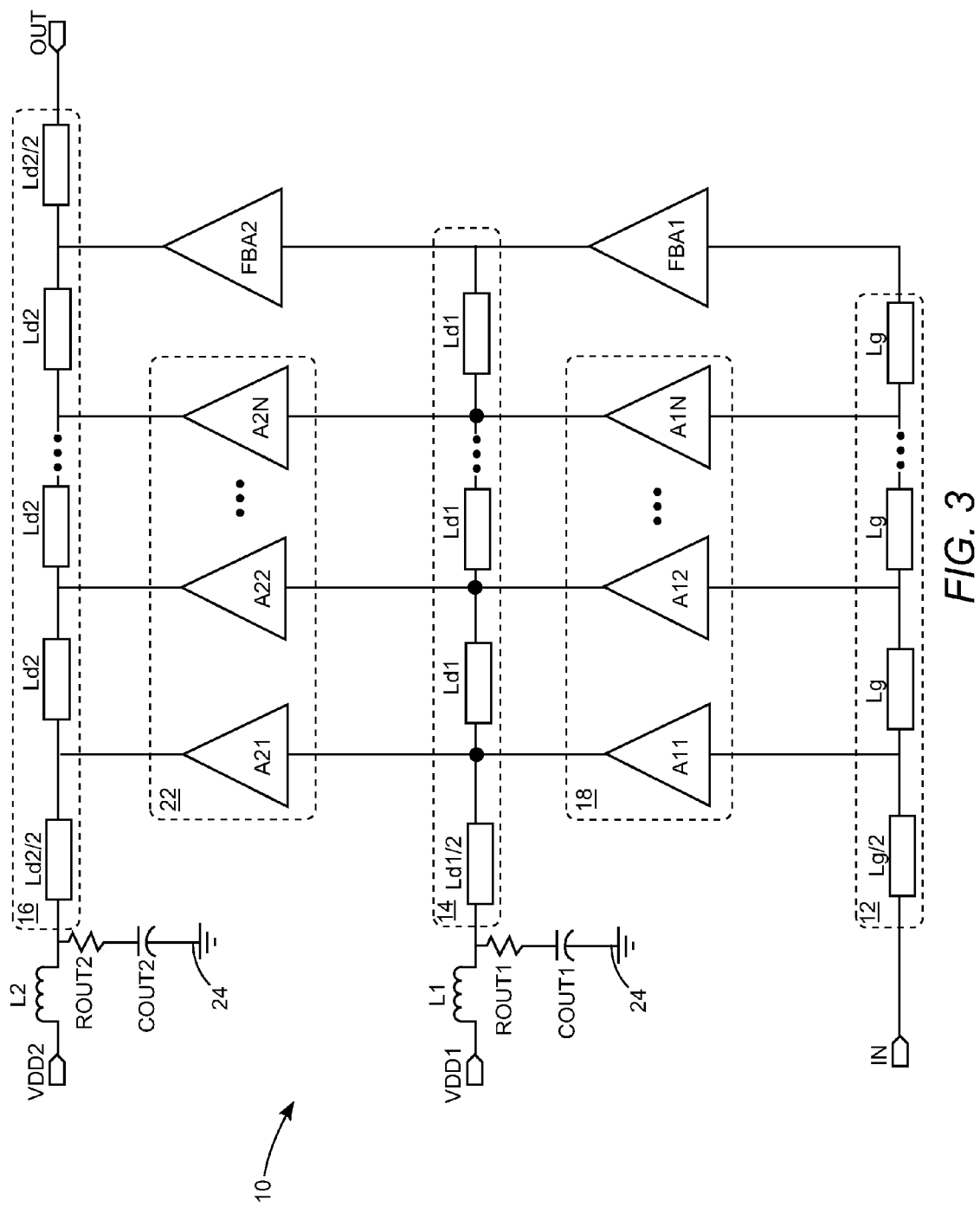
FIG. 3 is a schematic diagram of a modified version of the basic embodiment of the matrix distributed amplifier that employs feedback amplifiers in place of the termination amplifiers.

FIG. 3 illustrates another embodiment where the termination amplifiers depicted in FIG. 2 are made up of a first termination feedback amplifier FBA1 and a second termination feedback amplifier FBA2. In this embodiment, local feedback may be applied to a terminating amplifier for setting a broadband low noise input impedance. As mentioned previously, the application of these termination amplifiers may apply to multiple amplifier sections in an amplifier row for optimizing broadband characteristics. The intermediate transmission line 14 is shared between two different rows of amplifiers. The impedance of the intermediate transmission line 14 does not necessarily need to be 50 ohms, but may be optimized for broadband noise and linearity performance. In some cases, the impedance of the intermediate transmission line 14 is lower than 50 ohms in order to efficiently achieve power and linearity performance from the first input row of amplifiers (A11, A12, A13 . . . A1N). Normally a lower resistive terminating impedance for the intermediate transmission line 14 would result in higher noise contribution from the second stage row of amplifiers (A21, A22 . . . A2N). However, employing the active second terminating feedback amplifier FBA2, which provides a lower noise terminating impedance, high linearity may be achieved by providing a lower termination impedance without compromising noise figure performance.

In fact, in a reduction to practice using feedback termination amplifiers as depicted above, lower broadband noise figure was achieved from a low noise matrix distributed amplifier 10 as compared to a conventionally cascaded two stage distributed amplifier approach due to the added flexibility of being able to set the optimal intermediate terminating impedance of the low noise matrix distributed amplifier 10 topology with the low noise termination amplifier concept. This is a non-obvious and novel benefit of combining the matrix amplifier with the termination amplifier concept.

Figure 4:
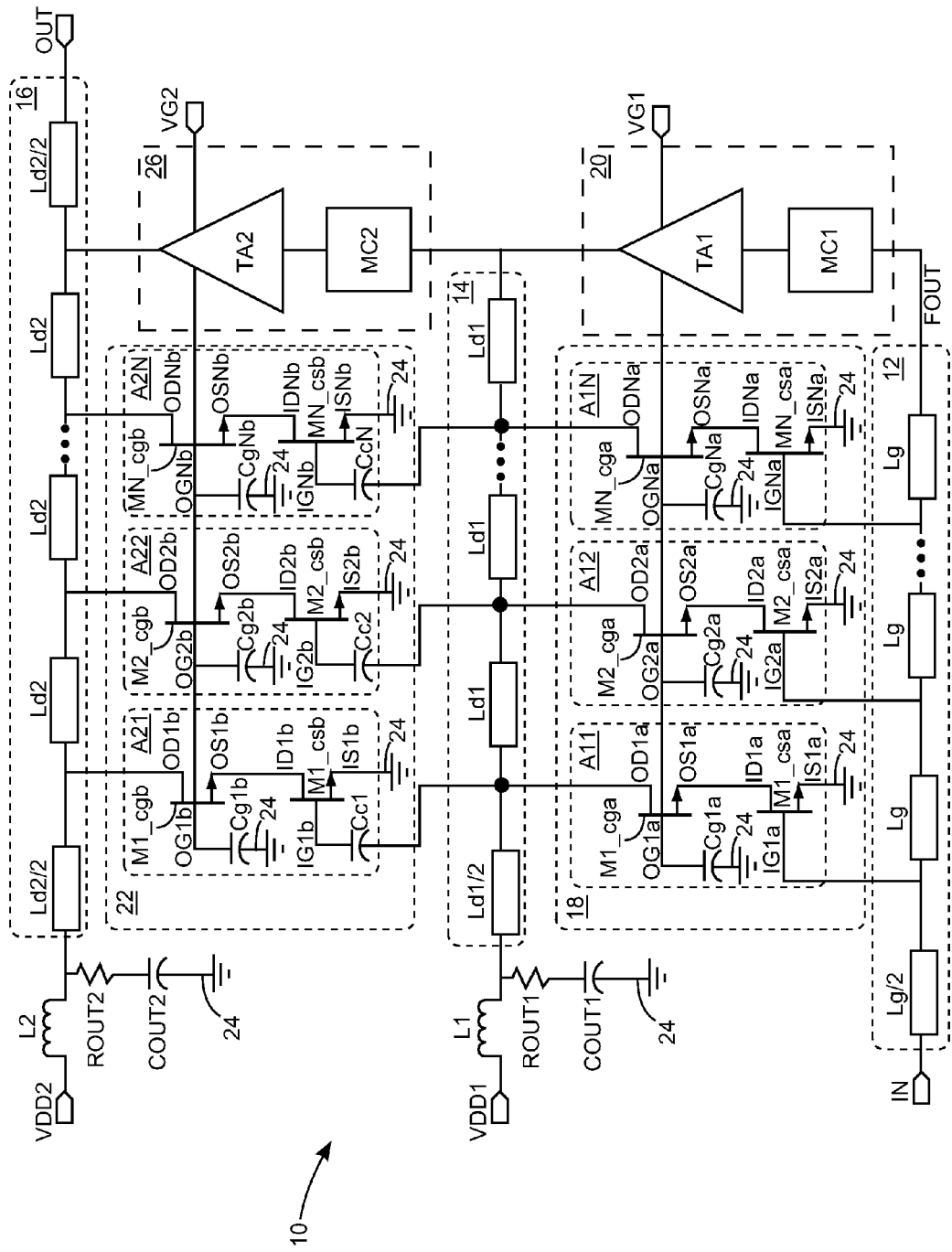
FIG. 4 is a schematic diagram of the matrix distributed amplifier of FIG. 2 detailing amplifier sections made up of cascode amplifiers.

FIG. 4 shows another embodiment wherein the embodiment of FIG. 2 employs cascode transconductor cells as the main amplifier elements making up the first plurality of amplifiers 18 and the second plurality of amplifiers 22. Cascode cells are advantageous due to their wider gain-bandwidth capabilities, and distributed thermal and electrical properties. This is preferred when trying to achieve low noise and high linearity from a high voltage GaN technology. The cascode configuration helps distribute the voltage across two devices, distributing the internal power dissipation and lowering device junction temperature which is beneficial for lower noise performance and reliable device operation.

In particular, the first plurality of amplifiers 18 includes a first common gate transistor M1_cga and a first common source transistor M1_csa that make up the cascode cell of amplifier A11. The first common gate transistor M1_cga has an output gate OG1$a$ coupled to the common node 24 via a first gate capacitor Cg1$a$. The output gate OG1$a$ is also coupled to a common gate direct current (DC) supply (VG1). An output drain OD1$a$ of the first common gate transistor M1_cga is coupled to the intermediate transmission line 14 between the inductive element Ld1/2 and an adjacent one of the inductive elements labeled Ld1. The first common source transistor M1_csa has an input drain ID1$a$ coupled to an output source OS1$a$ of the first common gate transistor M1_cga and an input source IS1$a$ coupled to the common node 24. An input gate IG1$a$ of the first common source transistor M1_csa is coupled to the input transmission line 12 between the inductive element Lg/2 and an adjacent one of the inductive elements labeled Lg.

Similarly, the first plurality of amplifiers 18 also includes a second common gate transistor M2_cga and a second common source transistor M2_csa that make up the cascode cell of the amplifier A12. The second common gate transistor M2_cga has an output gate OG2$a$ coupled to the common node 24 via a second gate capacitor Cg2$a$. The output gate OG2$a$ is also coupled to the common gate direct current (DC) supply (VG1). An output drain OD2$a$ of the second common gate transistor M2_cga is coupled to the intermediate transmission line 14 between the inductive elements labeled Ld1 adjacent to the inductive element Ld1/2. The second common source transistor M2_csa has an input drain ID2$a$ coupled to an output source OS2$a$ of the second common gate transistor M2_cga and an input source IS2$a$ coupled to the common node 24. An input gate IG2$a$ of the second common source transistor M2_csa is coupled to the input transmission line 12 between the inductive elements labeled Lg adjacent to the inductive element Lg/2.

Likewise, the first plurality of amplifiers 18 also includes an Nth common gate transistor MN_cga and an Nth common source transistor MN_csa that make up the cascode cell of the amplifier A1N. The Nth common gate transistor MN_cga has an output gate OGNa coupled to the common node 24 via an Nth gate capacitor CgNa. The output gate OGNa of the Nth common gate transistor MN_cga is also coupled to the common gate direct current (DC) supply (VG1). An output drain ODNa of the Nth common gate transistor MN_cga is coupled to the intermediate transmission line 14 between the inductive elements labeled Ld1 adjacent to the inductive element labeled Ld1 that is coupled to the output of the termination amplifier TA1. The Nth common source transistor MN_csa has an input drain IDNa coupled to an output source OSNa of the Nth common gate transistor MN_cga and an input source ISNa coupled directly to the common node 24. An input gate IGNa of the Nth common source transistor MN_csa is coupled to the input transmission line 12 between the inductive elements labeled Lg adjacent to the impedance matching circuit MC1.

Correspondingly, the second plurality of amplifiers 22 includes a first common gate transistor M1_cgb and a first common source transistor M1_csb that make up the cascode cell of the amplifier A21. The first common gate transistor M1_cgb has an output gate OG1$b$ coupled to the common node 24 via a first gate capacitor Cg1$b$. The output gate OG1$b$ is also coupled to a common gate direct current (DC) supply (VG2). An output drain OD1$b$ of the first common gate transistor M1_cgb is coupled to the output transmission line 16 between the inductive element Ld2/2 furthest from the matrix DA output OUT and an adjacent one of the inductive elements labeled Ld2. The first common source transistor M1_csb has an input drain ID1$b$ coupled to an output source OS1$b$ of the first common gate transistor M1_cgb and an input source IS1$b$ coupled to the common node 24. An input gate IG1$b$ of the first common source transistor M1_csb is coupled to the intermediate transmission line 14 between the inductive element Ld1/2 and an adjacent one of the inductive elements labeled Ld1 via a first coupling capacitor Cc1.

Similarly, the second plurality of amplifiers 22 also includes a second common gate transistor M2_cgb and a second common source transistor M2_csb that make up the cascode cell of the amplifier A22. The second common gate transistor M2_cgb has an output gate OG2$b$ coupled to the common node 24 via a second gate capacitor Cg2$b$. The output gate OG2$b$ is also coupled to the common gate direct current (DC) supply (VG2). An output drain OD2$b$ of the second common gate transistor M2_cgb is coupled to the output transmission line 16 between the inductive elements labeled Ld2 adjacent to the inductive element Ld2/2 furthest from the matrix DA output OUT. The second common source transistor M2_csb has an input drain ID2b coupled to an output source OS2b of the second common gate transistor M2_cgb and an input source IS2b coupled to the common node 24. An input gate 102b of the second common source transistor M2_csb is coupled to the intermediate transmission line 14 between the inductive elements labeled Ld1 adjacent to the inductive element Ld1/2 via a second coupling capacitor Cc2.

Likewise, the second plurality of amplifiers 22 also includes an Nth common gate transistor MN_cgb and an Nth common source transistor MN_csb that make up the cascode cell of the amplifier A2N. The Nth common gate transistor MN_cgb has an output gate OGNb coupled to the common node 24 via an Nth gate capacitor CgNb. The output gate OGNb is also coupled to the common gate direct current (DC) supply (VG2). An output drain ODNb of the Nth common gate transistor MN_cgb is coupled to the output transmission line 16 between the inductive elements labeled Ld2 adjacent to the inductive element Ld2/2 closest to the matrix DA output OUT. The Nth common source transistor MN_csb has an input drain IDNb coupled to an output source OSNb of the second common gate transistor MN_cgb and an input source ISNb coupled to the common node 24. An input gate IGNb of the Nth common source transistor MN_csb is coupled to the intermediate transmission line 14 between the inductive elements labeled Ld1 adjacent to the second impedance matching network MC2 via an Nth coupling capacitor CcN.

The matrix amplifier 10 employs special features that lower noise. For example, successive ones of the first plurality of amplifiers 18 and the second plurality of amplifiers 22 going from the input IN to the matrix DA output OUT employ increasing device periphery to distribute terminating impedance across the matrix DA 10. The increasing device periphery is indicated by the relative increase in transistor symbol size in FIG. 4. However, it should be understood that the relative sizes of the transistor symbols depicted in FIG. 4 are exemplary and different relative sizes representing device periphery may be utilized without deviating from the scope of the disclosure. Moreover, it is preferable for the devices making up the first plurality of amplifiers 18 and the second plurality of amplifiers 22 to be a plurality of tapered gate transconductance devices. Each of the devices has a gate-to-source capacitance. In one embodiment, the gate-to-source capacitance of each of the plurality of tapered gate periphery transconductance devices increases moving from the DA input IN to the first output FOUT. In another embodiment, the gate-to-source capacitance of each of the plurality of tapered gate periphery transconductance devices decreases moving from the DA input IN to the first output FOUT. In this manner, successive ones of the first plurality of amplifiers 18 and the second plurality of amplifiers 22 comprise tapered active impedance circuits to provide a gradually tapered impedance transition. The first plurality of amplifiers 18 and the second plurality of amplifiers 22 may comprise gallium nitride (GaN) devices to realize a GaN low noise matrix DA.

Figure 5:
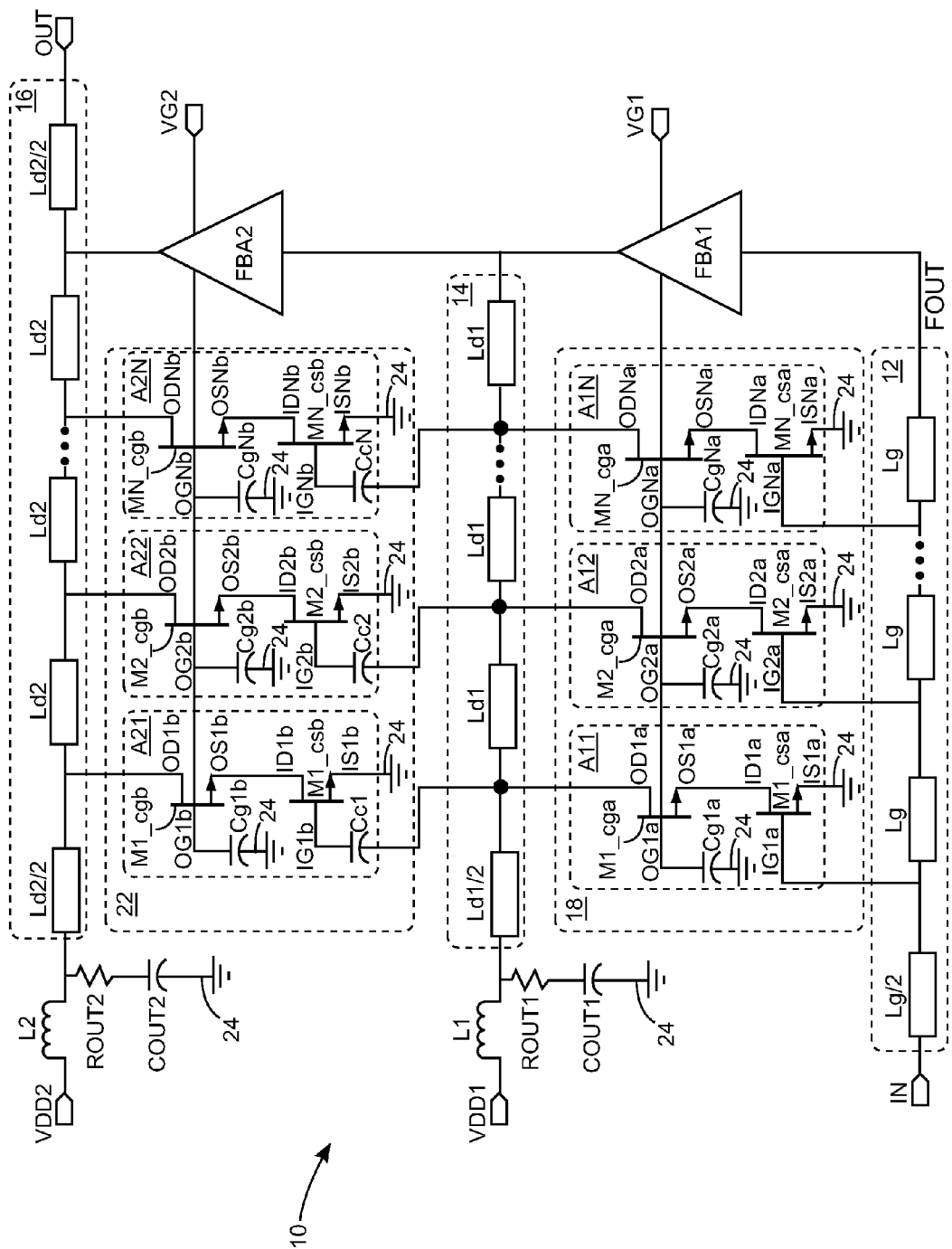
FIG. 5 is a schematic diagram of the matrix distributed amplifier of FIG. 3 detailing amplifier sections made up of cascode amplifiers.

FIG. 5 shows another preferred embodiment where the embodiment of FIG. 4 employs feedback amplifiers FBA1 and FBA2 in place of the input termination network 20 and the input termination network 26. While feedback amplifiers are shown as termination amplifiers of the last section of each transmission line, it should be appreciated that other types of amplifiers with similar broadband input matching and noise characteristics may be employed.

A basic embodiment of the present disclosure was modeled and simulated in a GaN HEMT technology with fT~85 GHz and off-state breakdown voltage of BVdg~60V. Flat gain and a relatively small return-loss was a monitored goal of the simulation. Because of the need for both low noise which is sensitive to device junction temperature, and simultaneously high linear output power>5 Watts and linearity>48 dBm OIP3, thermal management of the chip was included. As a result, a matrix distributed amplifier approach combined with cascode devices was considered because it provides thermal distribution of the active transistor junction temperatures to allow low noise figure under high operating voltages required to provide high linear output power. However, due to the limited noise figure of conventional matrix distributed amplifiers (>2 dB), a means for reducing the noise figure while maintaining the linear output power capability was developed.

Figure 6:
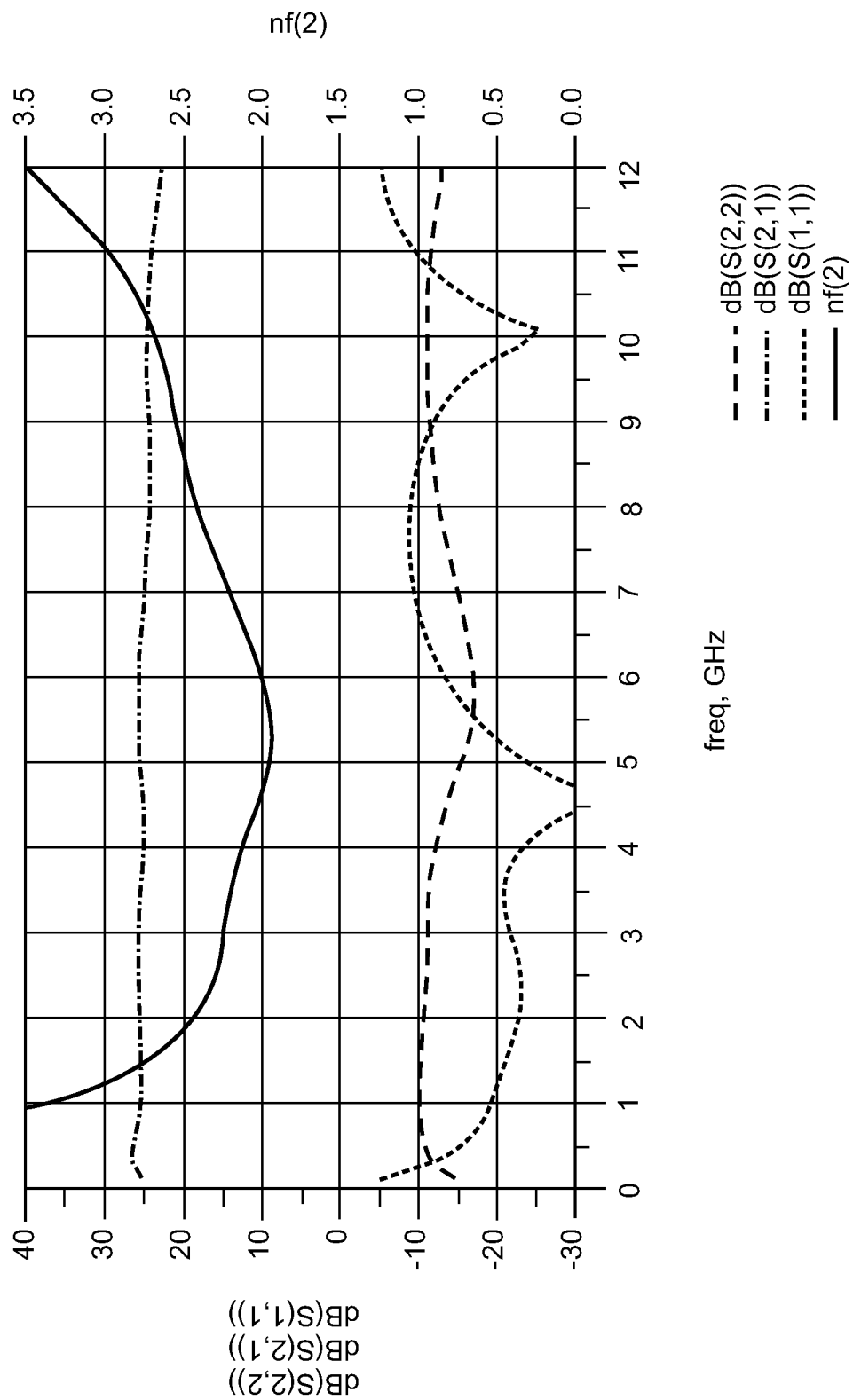
FIG. 6 is a graph depicting scattering parameter and noise figure performance of a two-stage distributed amplifier.

FIG. 6 gives the simulated wide-band S-parameter and noise figure performance of a GaN cascaded two stage DA. The gain is >22 dB across a 2.5-11 GHz bandwidth and a modest noise figure of roughly 2-3 dB across the same band. The return losses are roughly 10 dB or better. The first stage DA of this two stage DA employs the low noise termination amplifier technique, while the second stage DA employs a conventional capacitive coupled distributed amplifier topology. While this two stage approach achieves high gain, the two stage noise figure is limited by the cascaded amplifier approach.

Note, that a capacitive coupled second stage DA is employed in order to improve the output power and linearity bandwidth for the overall two stage performance. Note also that the capacitive coupling limits the low frequency noise performance and is not a limitation of this disclosure, which may provide improved noise performance down to baseband frequencies.

Figure 7:
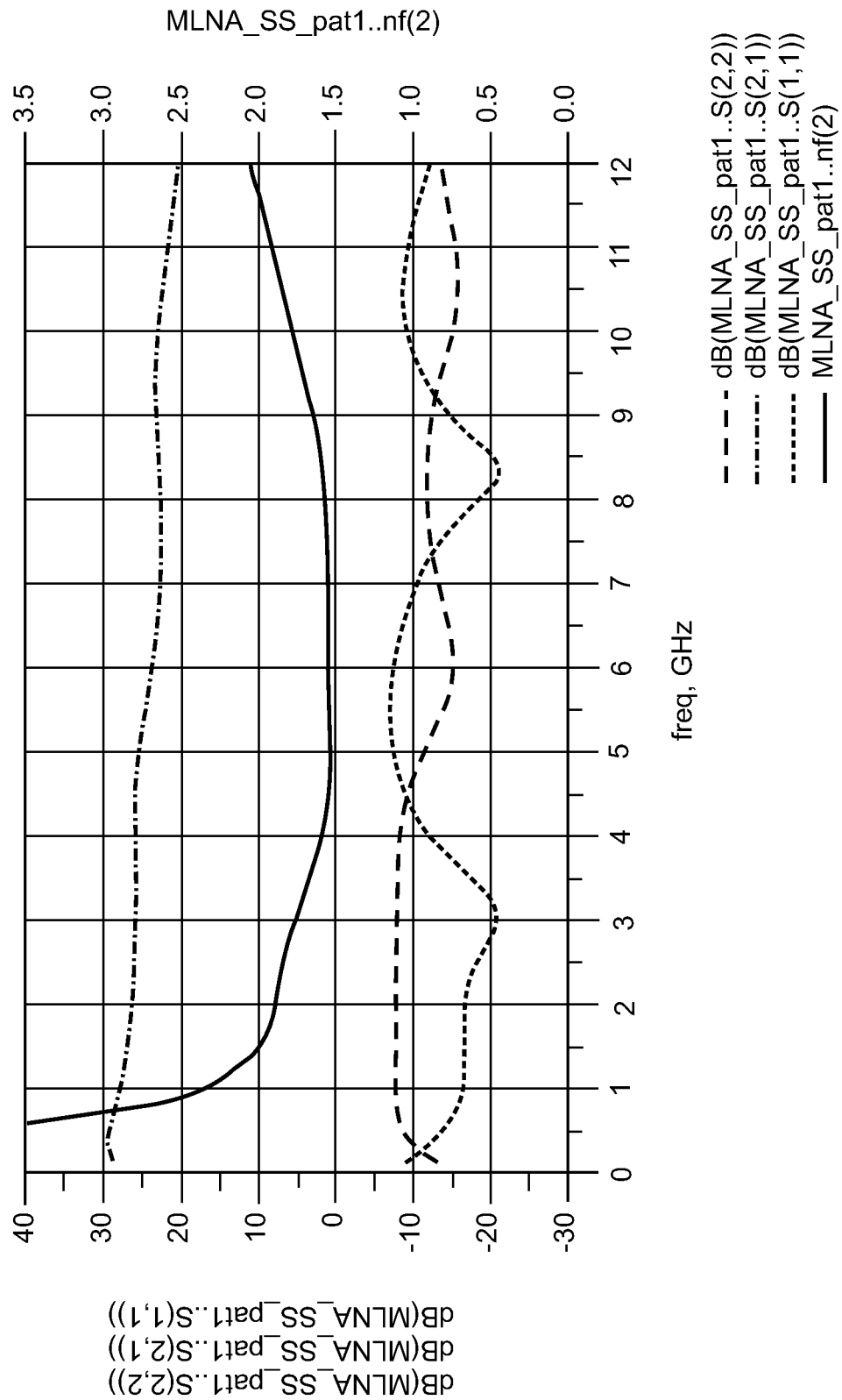
FIG. 7 is a graph depicting scattering parameter and noise figure performance of the matrix distributed amplifier of FIG. 5.

FIG. 7 gives the S-parameter and noise figure performance of the low noise matrix distributed amplifier 10 embodiment of FIG. 5. The gain is better than 20 dB across the desired 2.5-11 GHz band with a noise figure<2 dB across the same band. The return-losses are roughly 10 dB across the band. The noise figure increases at lower frequencies due to the capacitive coupling between the plurality of first stage amplifiers and the plurality of output stage amplifiers. Note, a matrix amplifier implementation that omits the capacitive coupling between the 1st stage amplifiers and the output amplifiers would achieved less than 2 dB noise figure down to baseband (~MHz) frequencies and is not an inherent limitation of the present disclosure. The improvement in noise figure for the embodiment of FIG. 5 indicates the added benefit from applying low noise termination amplifiers to both the input transmission lines and output transmission lines of a 2×N matrix distributed amplifier combined with being able to optimize the characteristic impedance of the intermediate transmission line for noise and linearity.

Figure 8:
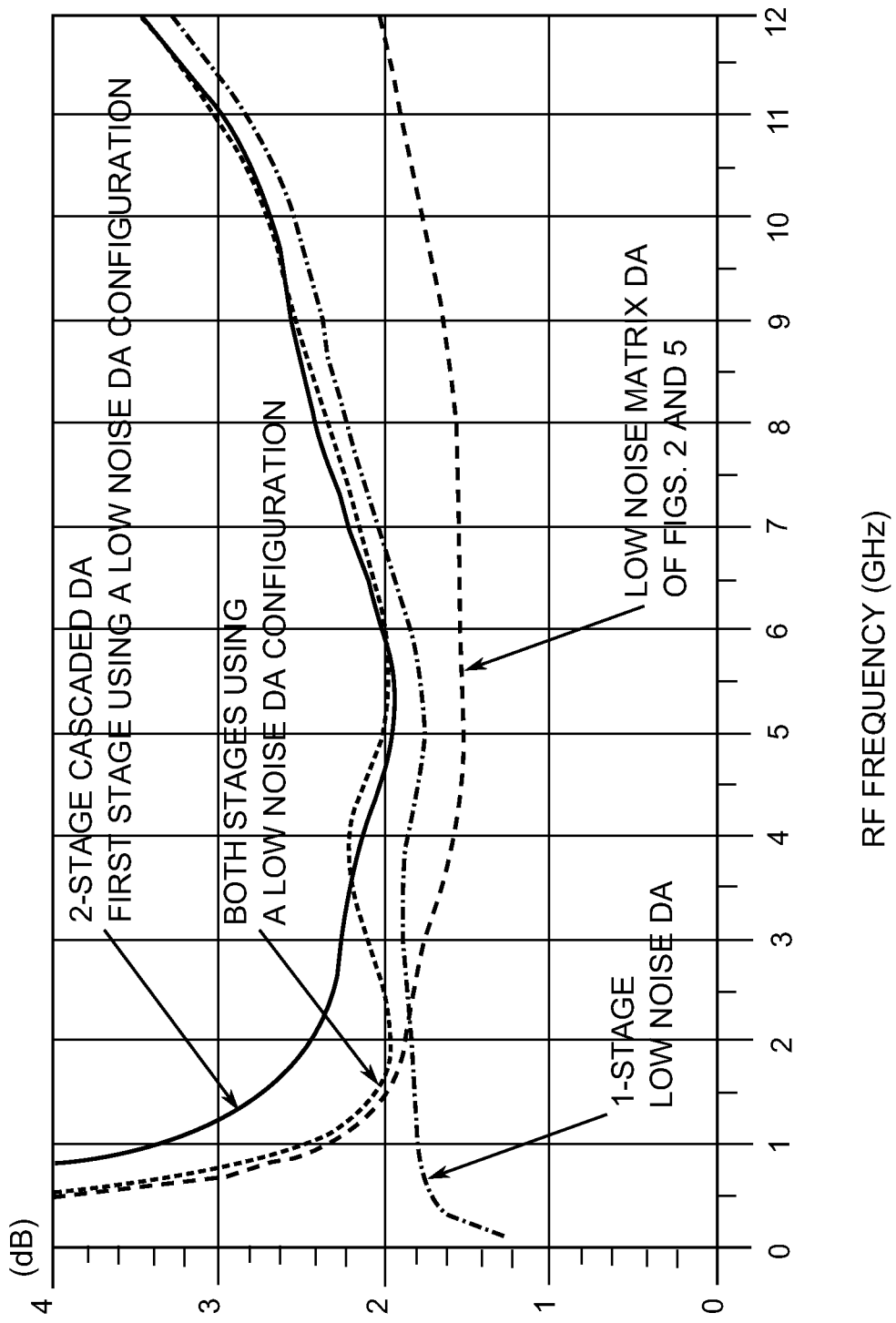
FIG. 8 is a graph depicting noise figure improvements of the low noise matrix amplifier of the present disclosure over related art distributed amplifier techniques.

FIG. 8 gives the simulated noise figure performance of four different designs illustrating the improvements obtained by employing the low noise techniques of the low noise matrix amplifier of the present disclosure. Sub-2 dB noise is obtained from a first stage DA from base band to 7 GHz, shown as the dashed and dotted trace and labeled "1-STAGE LOW NOISE DA." This amplifier is used as the first stage LNA in a two stage cascaded DA amplifier where the second stage is a traditional capacitive coupled DA. The combined two stage cascaded DA is represented by the solid trace and labeled "2-STAGE CASCADED DA FIRST STAGE USING A LOW NOISE DA CONFIGURATION." The noise is significantly higher than the first stage LN-DA noise figure, especially at low frequencies. The increase in noise at low frequencies is due to the noisy input termination resistor of the second stage as well as the coupling capacitors of the second stage. By replacing the input termination resistor of the second stage of the second stage cascaded DA with a termination amplifier, the noise figure is reduced significantly in the 1-3 GHz frequency range and is illustrated by the thin dashed trace labeled "BOTH STAGES USING A LOW NOISE DA CONFIGURATION." However, the noise figure is still modestly between 2 and 3 dB although this amplifier is a GaN two stage DA capable of nearly 8 Watts of output power. By incorporating the termination amplifiers to both the input and intermediate transmission lines of a 2×N matrix distributed amplifier, the noise figure can dramatically be improved across the band as compared to the two stage cascaded DA approach. The thick dashed trace labeled "LOW NOISE MATRIX DA OF FIGS. 2 AND 5" indicates <2 dB noise figure performance across the 2.5-11 GHz band resulting in 0.5-1 dB improvement in noise figure. This is a dramatic improvement in noise figure, and was achieved by reducing the resistive noise contributions of both input and intermediate transmission line terminations of a 2×N matrix distributed amplifier topology, as well as redefining the intermediate transmission line characteristic impedance for optimum noise and linearity performance.

While improved noise figure was achieved, the matrix DA design of this disclosure also took linearity into consideration by lowering the intermediate transmission line characteristic impedance to improve both wideband noise performance of the second stage amplifiers as well as improving the linearity of the first stage amplifiers of the 2×N matrix distributed amplifier. An improvement in noise figure would be dubious if the linearity was compromised since the objective is to provide high dynamic range over a broad band.

Figure 9:
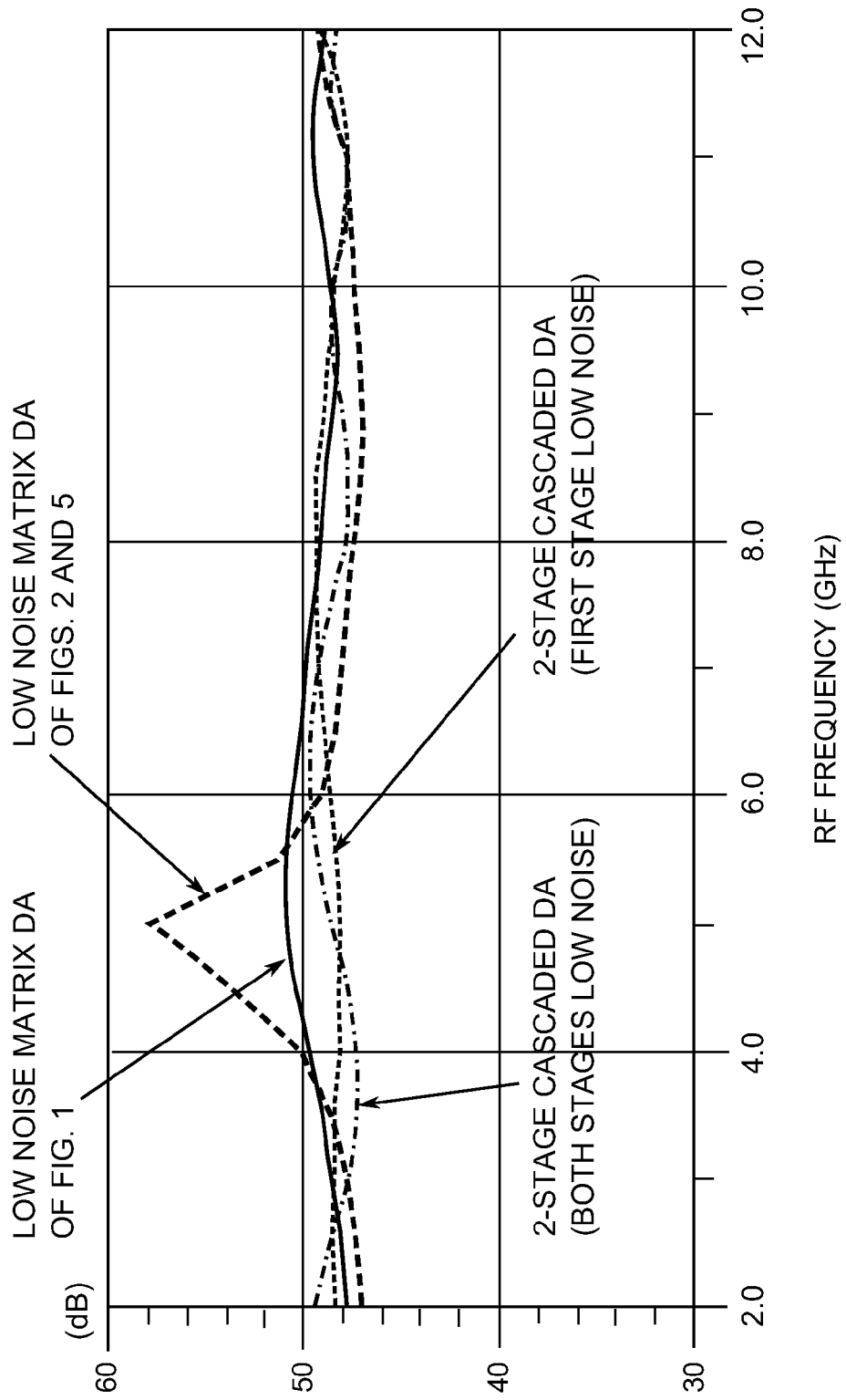
FIG. 9 is a graph depicting output third-order intercept point (OIP3) performance of the low noise matrix amplifier of the present disclosure illustrating no significant linearity degradation over related art techniques.

FIG. 9 gives the simulated OIP3 performance of four different designs. The thin dashed line labeled "2-STAGE CASCADED DA (FIRST STAGE LOW NOISE)" illustrates the conventional cascaded two stage performance with the low noise termination amplifier applied to the first stage. The dotted and dashed trace labeled "2-STAGE CASCADED DA (BOTH STAGES LOW NOISE)" illustrates the conventional cascaded two stage performance with both first and second stage employing low noise termination amplifiers. The average performance across the band is nearly the same. The solid trace labeled "LOW NOISE MATRIX DA OF FIG. 1" of the present disclosure actually shows slightly higher OIP3 linearity performance compared to the two stage performance. Finally the thick dashed trace labeled "LOW NOISE MATRIX DA OF FIGS. 2 AND 5" also illustrates increased OIP3 linearity performance. Thus, significantly lower noise figure performance can be achieved from the low noise matrix distributed amplifier 10 of the present disclosure without compromising linearity performance compared to the traditional two stage cascaded DA amplifier approach.

Those skilled in the art will recognize improvements and modifications to the preferred embodiments of the present disclosure. For example, it is to be understood that additional intermediate transmission lines along with corresponding pluralities of amplifiers terminated by termination amplifiers may provide additional improvements in gain, bandwidth, and noise figure. All such improvements and modifications are considered within the scope of the concepts disclosed herein and the claims that follow.

What is claimed is:

1. A matrix distributed amplifier (DA) comprising:
   an input transmission line;
   an intermediate transmission line;
   an output transmission line;
   a first plurality of amplifiers having inputs coupled to and spaced along the input transmission line and having outputs coupled to and spaced along the intermediate transmission line;
   a second plurality of amplifiers having inputs coupled to and spaced along the intermediate transmission line and having outputs coupled to and spaced along the output transmission line; and
   a termination amplifier having an input coupled to the input transmission line and an output coupled to the intermediate transmission line, and wherein selective successive ones of the first plurality of amplifiers and selective successive ones of the second plurality of amplifiers each include increased feedback.

2. The matrix DA of claim 1 further including an impedance matching network coupled between the input transmission line and the input of the termination amplifier.

3. The matrix DA of claim 1 further including a first RF choke coupled between a first bias input on the intermediate transmission line and a first voltage source.

4. The matrix DA of claim 3 further including a termination network coupled to a second bias input on the output transmission line.

5. The matrix DA of claim 3 further including a second RF choke coupled between a second bias input and a second voltage source.

6. The matrix DA of claim 1 further including a termination network coupled to a first bias input.

7. The matrix DA of claim 1 wherein the termination amplifier is a feedback amplifier.

8. The matrix DA of claim 1 wherein one of the second plurality of amplifiers is a second termination amplifier having an input coupled to a termination node of the intermediate transmission line and an output coupled to an output node of the output transmission line.

9. The matrix DA of claim 8 wherein the output node is adjacent to a DA output.

10. The matrix DA of claim 8 or 9 wherein the second termination amplifier is a feedback amplifier.

11. The matrix DA of claim 1 wherein successive ones of the first plurality of amplifiers and successive ones of the second plurality of amplifiers comprise tapered active impedance circuits to provide a gradually tapered impedance transition.

12. The matrix DA of claim 10 wherein selective successive ones of the first plurality of amplifiers and the successive ones of the second plurality of amplifiers each include transconductance devices with increased gate periphery.

13. The matrix DA of claim 1 wherein the first plurality of amplifiers and the second plurality of amplifiers comprise a plurality of tapered gate periphery transconductance devices, such that:
   each of the plurality of tapered gate periphery transconductance devices comprises a gate and a source with a gate-to-source capacitance; and
   the gate-to-source capacitance of each of the plurality of tapered gate periphery transconductance devices decreases moving from a DA input to a first output.

14. The matrix DA of claim 1 wherein the first plurality of amplifiers and the second plurality of amplifiers comprise a plurality of tapered gate periphery transconductance devices, such that:
   each of the plurality of tapered gate periphery transconductance devices comprises a gate and a source with a gate-to-source capacitance; and the gate-to-source capacitance of each of the plurality of tapered gate periphery transconductance devices increases moving from a DA input to a first output.

15. The matrix DA of claim 14 wherein an output impedance of each of the plurality of tapered gate periphery transconductance devices increase moving from the first input to the DA output to broaden an output power bandwidth of the matrix DA.

16. The matrix DA of claim 1 wherein the first plurality of amplifiers and the second plurality of amplifiers comprises a plurality of tapered gate periphery transconductance devices, such that an output impedance of each of the plurality of tapered gate periphery transconductance devices increases moving from a first input to a first output of the input transmission line to broaden an output power bandwidth of the matrix DA.

17. The matrix DA of claim 1 wherein the first plurality of amplifiers and the second plurality of amplifiers comprise gallium nitride (GaN) devices.

18. The matrix DA of claim 1 wherein each of the first plurality of amplifiers and each of the second plurality of amplifiers is a cascode amplifier comprising:
    a first tapered gate transconductance device comprising:
        an input gate;
        an input source coupled to a common node; and
        an input drain; and
    a second tapered gate transconductance device comprising:
        an output gate coupled to a common gate direct current (DC) supply;
        an output source coupled to the input drain; and
        an output drain.

19. The matrix DA of claim 18 wherein a gate-to-source capacitance of each of the first plurality of amplifiers increases moving from a DA input to a first output of the input transmission line and the second plurality of amplifiers increases moving from a bias input on the output transmission line to a DA output of the output transmission line.

20. The matrix DA of claim 18 wherein a gate-to-source capacitance of each of the first plurality of amplifiers decreases moving from a DA input to a first output of the input transmission line and the second plurality of amplifiers decreases moving from a second bias input to a DA output of the output transmission line.

21. A matrix distributed amplifier (DA) comprising:
    a first plurality of amplifiers;
    a second plurality of amplifiers;
    a first plurality of inductive elements coupled between a DA input and a first output forming a node between each of the first plurality of inductive elements wherein each node is coupled to an input of a corresponding one of the first plurality of amplifiers;
    a second plurality of inductive elements coupled between a first bias input and an intermediate output forming a node between each of the second plurality of inductive elements wherein each node is coupled to an output of a corresponding one of the first plurality of amplifiers and is also coupled to an input of a corresponding one of the second plurality of amplifiers;
    a third plurality of inductive elements coupled between a second bias input and a DA output forming a node between each of the third plurality of inductive elements and wherein each node is coupled to an output of corresponding ones of the second plurality of amplifiers; and
    an input of a termination amplifier coupled to the first output and an output of the termination amplifier coupled to a termination node adjacent to the intermediate output, and wherein selective successive ones of the first plurality of amplifiers and selective successive ones of the second plurality of amplifiers each include increased feedback.

22. The matrix DA of claim 21 wherein one of the second plurality of amplifiers is a second termination amplifier having an input coupled to the termination node and an output coupled to an output node nearest the DA output.

23. The matrix DA of claim 22 wherein the output node is adjacent to the DA output.

24. The matrix DA of claim 22 or 23 wherein the second termination amplifier is a feedback amplifier.

25. The matrix DA of claim 21 wherein successive ones of the first plurality of amplifiers and successive ones of the second plurality of amplifiers comprise tapered active impedance circuits to provide a gradually tapered impedance transition.

26. The matrix DA of claim 21 wherein the first plurality of amplifiers and the second plurality of amplifiers comprise gallium nitride (GaN) devices.

* * * * *